(12) United States Patent
Liu et al.

(10) Patent No.: US 12,078,831 B2
(45) Date of Patent: Sep. 3, 2024

(54) OPTICAL PROJECTION IMAGING SYSTEM AND METHOD

(71) Applicant: CHONGQING KONKA PHOTOELECTRIC TECHNOLOGY RESEARCH INSTITUTE CO., LTD., Chongqing (CN)

(72) Inventors: Zhengming Liu, Chongqing (CN); Ruilin Xu, Chongqing (CN); Jiahuang Yan, Chongqing (CN)

(73) Assignee: CHONGQING KONKA PHOTOELECTRIC TECHNOLOGY RESEARCH INSTITUTE CO., LTD., Chongqing (CN)

(*) Notice: Subject to any disclaimer, the term of this patent is extended or adjusted under 35 U.S.C. 154(b) by 73 days.

(21) Appl. No.: 17/056,767

(22) PCT Filed: Nov. 28, 2019

(86) PCT No.: PCT/CN2019/121382
§ 371 (c)(1),
(2) Date: Nov. 19, 2020

(87) PCT Pub. No.: WO2021/102765
PCT Pub. Date: Jun. 3, 2021

(65) Prior Publication Data
US 2022/0286653 A1    Sep. 8, 2022

(51) Int. Cl.
  *G02B 5/30* (2006.01)
  *G03B 21/20* (2006.01)
  *H01L 25/16* (2023.01)

(52) U.S. Cl.
  CPC ....... *G02B 5/3016* (2013.01); *G03B 21/2033* (2013.01); *G03B 21/2073* (2013.01); *G03B 21/208* (2013.01); *H01L 25/167* (2013.01)

(58) Field of Classification Search
  CPC .............. G02B 5/3016; G03B 21/2033; G03B 21/2073; G03B 21/208; G03B 21/142;
  (Continued)

(56) References Cited

U.S. PATENT DOCUMENTS

2009/0169192 A1   7/2009   Yang et al.
2014/0016042 A1   1/2014   Yamauchi
(Continued)

FOREIGN PATENT DOCUMENTS

CN        1823299 A     8/2006
CN      101169520 A     4/2008
(Continued)

OTHER PUBLICATIONS

First examination report of corresponding CN application No. 201980002877.5.
(Continued)

*Primary Examiner* — Magda Cruz
(74) *Attorney, Agent, or Firm* — Samson G. Yu (57) ABSTRACT

The present disclosure discloses an optical projection imaging system and method. Through additionally installing an angle controller on a Light Emitting Diode (LED) chip, and through adjusting and controlling an emitting angle of light emitted by the LED chip every preset time period by the angle controller, different images projected in different emitting angles are obtained, and a whole image is spliced by the different images projected in the different emitting angles and projected to a projection screen. In addition, the present disclosure further discloses an optical projection imaging method.

20 Claims, 8 Drawing Sheets

(58) Field of Classification Search
CPC ..... G03B 21/006; H01L 25/167; H01L 33/58; H01L 25/0753; G09G 3/001; H04N 9/3147; H04N 9/3138
See application file for complete search history.

(56) References Cited

U.S. PATENT DOCUMENTS

2016/0327783 A1* 11/2016 Xu .................. H04N 9/3155
2020/0033598 A1* 1/2020 Ma .................. H04N 9/3188

FOREIGN PATENT DOCUMENTS

| | | |
|---|---|---|
| CN | 104614929 A | 5/2015 |
| CN | 105068354 A | 11/2015 |
| CN | 105527789 A | 4/2016 |
| CN | 105632384 A | 6/2016 |
| CN | 206161977 A | 5/2017 |
| CN | 108459455 A | 8/2018 |
| CN | 207731065 U | 8/2018 |
| CN | 108957755 A | 12/2018 |
| CN | 109188839 A | 1/2019 |
| CN | 208384231 U | 1/2019 |
| JP | 2010139590 A | 6/2010 |

OTHER PUBLICATIONS

Notice of rejection of corresponding CN application No. 201980002877.5.

* cited by examiner

OPTICAL PROJECTION IMAGING SYSTEM AND METHOD

TECHNICAL FIELD

The present disclosure relates to the field of imaging technologies, and in particular to an optical projection imaging system and method.

BACKGROUND

At present, an optical system of a projector is generally a Light Emitting Diode (LCD) projection system or a Digital Light Processing (DLP) projection system. Both of these two projection systems emit light through a backlight source, and transmit the light to a liquid crystal modulation screen or a Micro Electromechanical System (MEMS) reflector array to generate an image by projection. However, configuration of a system that performs the projection by using the backlight source may cause that an overall projection system is huge in volume, users increasingly pursue the visual enjoyment of large-screen display, and expect that a projection device is miniaturized as possible. Thus, how to achieve volume miniaturization of a projection device, and project a large-screen image at the same time is a problem to be solved.

Therefore, the related art needs to be further improved.

SUMMARY

In view of disadvantages in the above related art, the present disclosure provides an optical projection imaging system and method, so as to overcome the disadvantages in the related art that a projection system uses a backlight source to emit light, so that the projection system is large in volume, and the projection system with the large volume does not satisfy a requirement of large-screen display.

The present embodiment discloses an optical projection imaging system, including: an image source controller, a projection screen, an angle controller and an LED display; the LED display including: multiple LED display components, each of the LED display components including: an LED chip and an angle control structure arranged above the LED chip.

The angle controller is configured to send at least two different angle control signals to the LED display every preset time period to control the LED display to be in at least two different display modes.

The image source controller is configured to send at least two different image signal to the LED display, and the LED display in the different display modes corresponds to the different image signals.

The angle control structure is configured to receive at least two different angle control signals sent by the angle controller, and to respectively perform modulation of different angle directions on an emitting main light direction of each of the LED chips in the LED display, the modulation of the different angle directions corresponding to directions in which the at least two different image signals are projected.

The projection screen is configured to receive an image corresponding to the emitting main light modulated by the angle control structure to obtain a projection image.

In an optional embodiment, the at least two different display modes includes a first display mode and a second display mode, the at least two different image signals includes a first image signal and a second image signal, and the projection image is an image spliced by a first image corresponding to the first image signal and a second image corresponding to the second image signal.

In an optional embodiment, the LED display further includes: a collimation optical element configured to collimate the emitting main light of the LED chip, the collimation optical element includes: a micro-lens array, a micro-ring-type structure or a photonic crystal array.

In an optional embodiment, the angle control structure includes: an optical axis control apparatus and an optical film structure successively configured along an emitting light path of the emitting main light of the LED chip.

The optical axis control apparatus includes: a metal wire gate electrode, a transparent electrode and an optical rotation material layer successively configured along the emitting light path of the LED chip, the optical rotation material layer is used for changing polarizability of the emitting main light.

The optical film structure includes: a macromolecule liquid crystal layer used for refracting the incident emitting main light.

In an optional embodiment, the macromolecule liquid crystal layer respectively has a first refractive index and a second refractive index for polarized light at different incident angles, and an emitting direction of the polarized light refracted by the first refractive index and an emitting direction of the polarized light refracted by the second refractive index are axially orthogonal.

In an optional embodiment, the optical film structure further includes: a UV resin layer configured after the macromolecule liquid crystal layer along the emitting light path of the LED chip.

In an optional embodiment, the optical projection imaging system further includes a projection lens configured between the LED display and a projection screen.

The projection lens is configured to receive and amplify the emitting main light emitted by the LED display.

In an optional embodiment, the LED chip is a Micro-LED.

The present embodiment further discloses an optical projection imaging method, and the projection imaging method includes the following operations.

The angle controller respectively sends control signals in at least two different angles to the LED display every preset time period, and controls the LED display to be in at least two different display modes.

The image source controller sends at least two different image signals to the LED display, wherein the LED display is in the different display modes correspond to the different image signals correspondingly.

The angle control structure receives at least two different angle control signals sent by the angle controller, and respectively performs modulation of different angle directions on emitting main light of each of the LED chips in the LED display, wherein the modulation of the different angle directions corresponds to directions in which the at least two different image signals are projected.

The projection screen receives an image corresponding to the emitting main light modulated by the angle control structure, to obtain a projection image.

In an optional embodiment, the at least two different display mode includes a first display mode and a second display mode, and the at least two different image signals includes a first image signal and a second image signal; and the projection image is an image spliced by a first image and a second image projected by the LED display every preset time period.

The operation that the image source controller sends the at least two different image signals to the LED display includes the following steps.

When the LED display is in the first display mode, the image source controller sends the first image signal to the LED display; and when the LED display is in the second display mode, the image source controller sends the second image signal to the LED display.

In an optional embodiment, after the operation that the image source controller sends the at least two different image signals to the LED display, the optical projection imaging method further includes the following steps.

Each of the LED chips in the LED display sends the emitting main light corresponding to a received image signal.

A collimation optical element performs collimation processing on the emitting main light of the LED chip.

In an optional embodiment, the at least two different angle control signals include a first angle control signal and a second angle control signal; the first angle control signal is used for controlling the LED display to be in the first display mode, and the second angle control signal is used for controlling the LED display to be in the second display mode; and the preset time period is a human eye visual persistence time period.

In an optional embodiment, the angle controller includes: an optical axis control apparatus and an optical film structure.

The optical axis control apparatus includes: a metal wire gate electrode, a transparent electrode and an optical rotation material layer.

The optical film structure includes: a macromolecule liquid crystal layer.

The operation that the angle controller respectively sends the first angle control signal and the second control signal to adjust and control an emitting angle of the emitting main light emitted by each of the LED chips includes the following steps.

When the first angle control signal is sent by the angle controller, the emitting main light emitted by each of the LED chips forms linear polarized light through the metal wire gate electrode; and under the action of the optical rotation material layer, the linear polarized light is enabled to be incident on the optical film structure, and to be emitted by the first angle after being refracted by the optical film structure.

Or, when the second angle control signal is sent by the angle controller, the emitting main light emitted by the LED chip forms linear polarized light through the metal wire gate electrode; and under the adjustment of the optical axis control apparatus, the linear polarized light is enabled to be incident on the optical film structure at an original emitting angle, and emits at the second angle after being refracted by the optical film structure.

In an optional embodiment, the operation that under the adjustment of the optical axis control apparatus, the linear polarized light is enabled to be incident on the optical film structure at the original emitting angle further includes the following step.

The optical axis control apparatus is enabled to be connected with an alternating current power supply, so that an output emitting angle of the linear polarized light input to the optical axis control apparatus by the optical rotation material layer remains unchanged.

In an optional embodiment, before the operation that the projection screen receives the image corresponding to the main light modulated by the angle control structure to obtain the projection image, further including the following step.

After the emitting main light emitted by the LED display is amplified, amplified emitting main light is projected to the projection screen.

Compared with the related art, at least some embodiments of the present disclosure have the following advantages.

According to the method provided by an implementation mode of the present disclosure, through adjusting and controlling an emitting angle of light emitted by the LED chip every preset time period by the angle controller, images projected in different emitting angles are obtained, and a whole image is spliced by the images projected in the different emitting angles, thereby large-screen display of the image is achieved, and a volume of the projection system is not increased by the method of the present disclosure, the emitting angle of the light emitted by the LED chip is adjusted, thus a cost is low, it is easy to achieve, and a requirement of the large-screen display is satisfied.

BRIEF DESCRIPTION OF THE DRAWINGS

In order to describe embodiments of the present disclosure or technical schemes in the related art more clearly, drawings that need to be used in descriptions of the embodiments or the related art are briefly introduced below. Apparently, the drawings described below are some embodiments recorded in the present disclosure, and under a precondition without creative work, other drawings may also be acquired by those of ordinary skill in the art according to these drawings.

DETAILED DESCRIPTION

In order to make those skilled in the art better understand schemes of the present disclosure, technical schemes in embodiments of the present disclosure are clearly and completely described below in combination with drawings in the embodiments of the present disclosure. Apparently, the embodiments described are a part of the embodiments of the present disclosure, and are not all of the embodiments. Based on the embodiments in the present disclosure, all other embodiments obtained by those of ordinary skill in the art without creative work shall fall within the scope of protection of the present disclosure.

It is discovered by the inventor that a projection apparatus in the related art, usually adopts a backlight source to emit light, and the backlight source is required to be modulated to project and generate an image. Therefore, the projection apparatus adopting the backlight source for projection has a problem of a larger volume generally. In order to overcome a disadvantage of the large volume of the projection device, and satisfy a requirement of large-screen display of a user at the same time, the inventor proposes to adopt a Micro LED to achieve self-illumination, the disadvantage of the backlight projection is overcome, and images projected to a projection screen are modulated at different emitting angles, image display of the large-screen is achieved by a way of image splicing.

In the related art, an LED display adopts backplane technologies in types such as Printed Circuit Board (PCB), glass, and flexible transparent Polyimide (PI), which include active and passive driving designs. A driving circuit array is manufactured on a backplane, required electrons and electron holes are provided to an LED, so as to send a light source to achieve a display function. A display device includes a display and a driver. The driver is configured in a non-display area around the display. The display includes multiple pixels P arranged in a matrix shape. The driver includes a scanning driver and a data driver. The scanning driver outputs a scanning signal to a scanning line on the display. The data driver outputs a data signal to a data line on the display. And each pixel P is connected with the data line and the scanning line.

Figure 1:
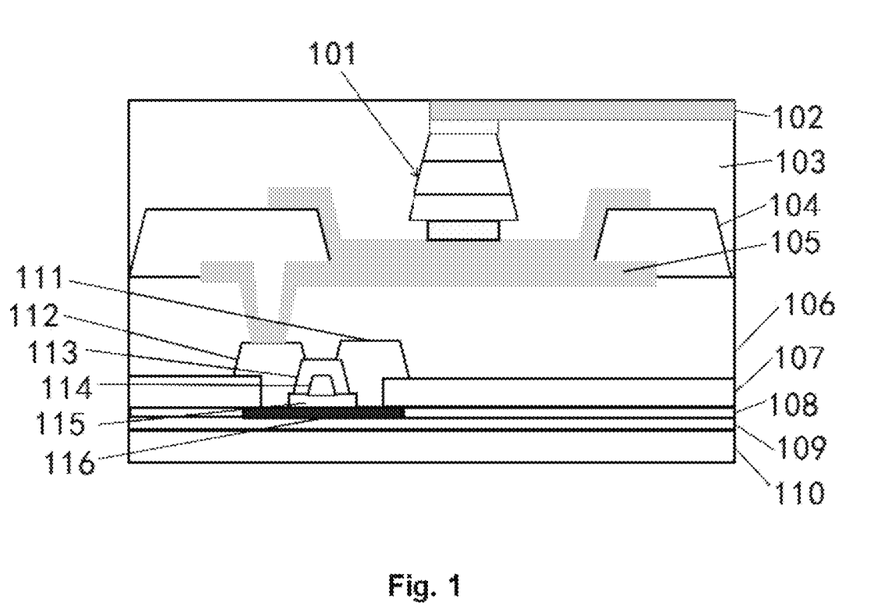
FIG. 1 is a structural schematic diagram of a light-emitting diode according to the related art.

As shown in FIG. 1, FIG. 1 is a structural schematic diagram of an LED display in the related art. A thin film transistor is used for driving and controlling each of the LED chips. And different wavelengths of light in red, green and blue colors are individually controlled, a full-color display effect is formed by cooperating with different gray-scale combinations. The LED includes: a substrate 110, a buffer layer 109, a first gate insulating layer 108, a first insulating layer 107, a planarization layer 106, a first electrode 105, a pixel separating structure 104, a protection insulating layer 103 and a second electrode 102 which are successively located above the substrate from bottom to top. And an LED chip 101 located above the pixel separating structure 104. The thin film transistor is further arranged above the substrate 110. The thin film transistor includes: a semiconductor layer 116, a second gate insulating layer 115, a gate electrode 114, a second insulating layer 113, a source electrode 112 and a drain electrode 111. The embodiment provided by the present disclosure is to adjust an emitting direction of light emitted by the LED chip, so that it is achieved that different images are respectively projected to a screen, and due to a phenomenon of visual persistence of human eyes, when the first image is switched to the second image, because memory of the first image seen in the human eyes still stays in a human brain, an image presented in the human eyes at this moment is a whole image spliced by the first image and the second image, therefore it is achieved that the whole image may be divided into two parts, images of the two parts are rapidly switched during human eye visual persistence time, so an effect that the whole image is seen by the human eyes is achieved.

Figure 2:
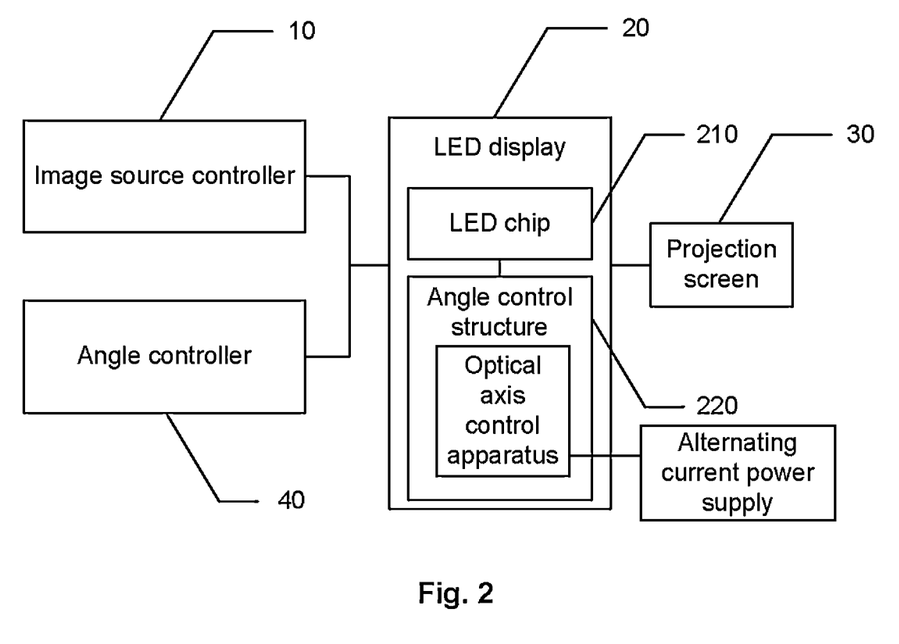
FIG. 2 is a structural schematic diagram of an optical projection imaging system according to an embodiment of the present disclosure.

Specifically, the embodiment of the present disclosure further discloses an optical projection imaging system, as shown in FIG. 2, the optical projection imaging system includes: an image source controller 10, a projection screen 30, an angle controller 40 and an LED display 20. The LED display 20 includes: multiple LED display components, each of the LED display components includes: an LED chip 210 and an angle control structure 220 arranged above the LED chip 210.

The angle controller 40 is configured to send at least two different angle control signals to the LED display every preset time period to control the LED display 20 to be in at least two different display modes.

The image source controller 10 is configured to send at least two different image signals to the LED display 20. The LED display 20 in the different display modes corresponds to the different image signals.

The angle control structure 220 is configured to receive at least two different angle control signals sent by the angle controller 40, and to respectively perform modulation of different angle directions on an emitting main light direction of each of the LED chips 210 in the LED display 20; and the modulation of the different angle directions corresponds to directions in which the at least two different image signals are projected.

The projection screen 30 is configured to receive an image corresponding to the emitting main light modulated by the angle control structure 220, to obtain a projection image.

The LED display 20 includes multiple LED components, each of the multiple LED components includes one LED chip, and an emitting direction of light emitted by each LED chip is adjustable. Specifically, the LED display 20 further includes: the angle control structure arranged above the LED chip.

The angle controller 40 sends the different angle control signals, which are respectively used for controlling the different display modes for the LED display, to the LED display 20.

In one implementation mode, through sending two angle control signals, the LED display is enabled to be in two different display modes. For example, the angle controller sends a first angle control signal to the LED display, so that the LED display is operated in a first display mode. The angle controller sends a second angle control signal to the LED display, so that the LED display is operated in a second display mode. The first display mode is a mode of a first angle of an image projected to a projection screen, and the second display mode is a mode of a second angle of an image projected to the projection screen. In the first display mode, emitting main light of each LED chip on the LED display is emitted along a direction of the first angle; and in the second display mode, the emitting main light of each LED chip on the LED display is emitted along a direction of the second angle.

Figure 3:
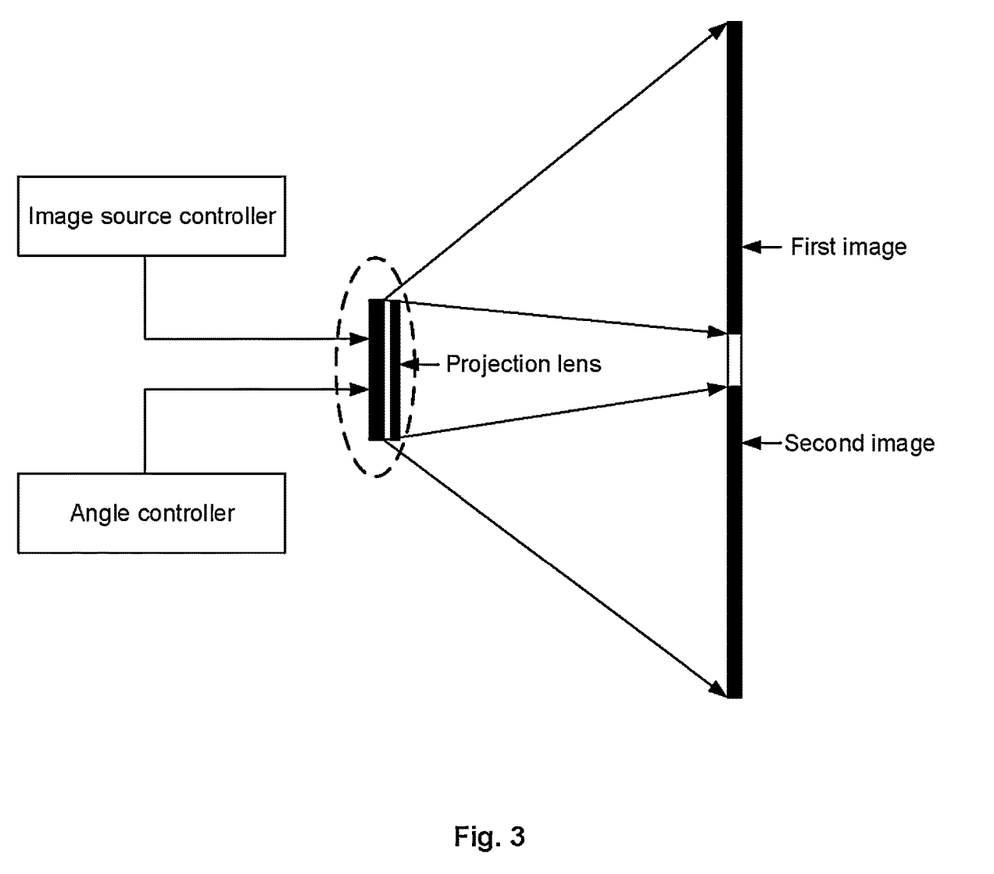
FIG. 3 is a projection schematic diagram of an optical projection imaging system according to an embodiment of the present disclosure.

As shown in FIG. 3, at least two different image signals sent to the LED display by the image source controller includes a first image signal and a second image signal. When the LED display is operated in the first display mode, the image source controller sends the first image signal to the LED display, so that the LED display projects a first image. When the LED display is operated in the second display mode, the image source controller sends the second image signal to the LED display, so that the LED display projects a second image. A whole projection image is spliced by the first image and the second image.

It is conceivable that every preset time period, the LED display may also be controlled to be in multiple display modes by the angle controller, so that at least three images are projected every the preset time period by the LED display, the whole image is spliced on the projection screen by the projected images.

A collimation optical element is configured in an emitting light path of the LED display, and used for collimating the light emitted by each LED in the LED display along a main light direction. In a specific implementation mode, the collimation optical element includes: a micro-lens array, a micro-ring-type structure or a photonic crystal array.

Figure 4:
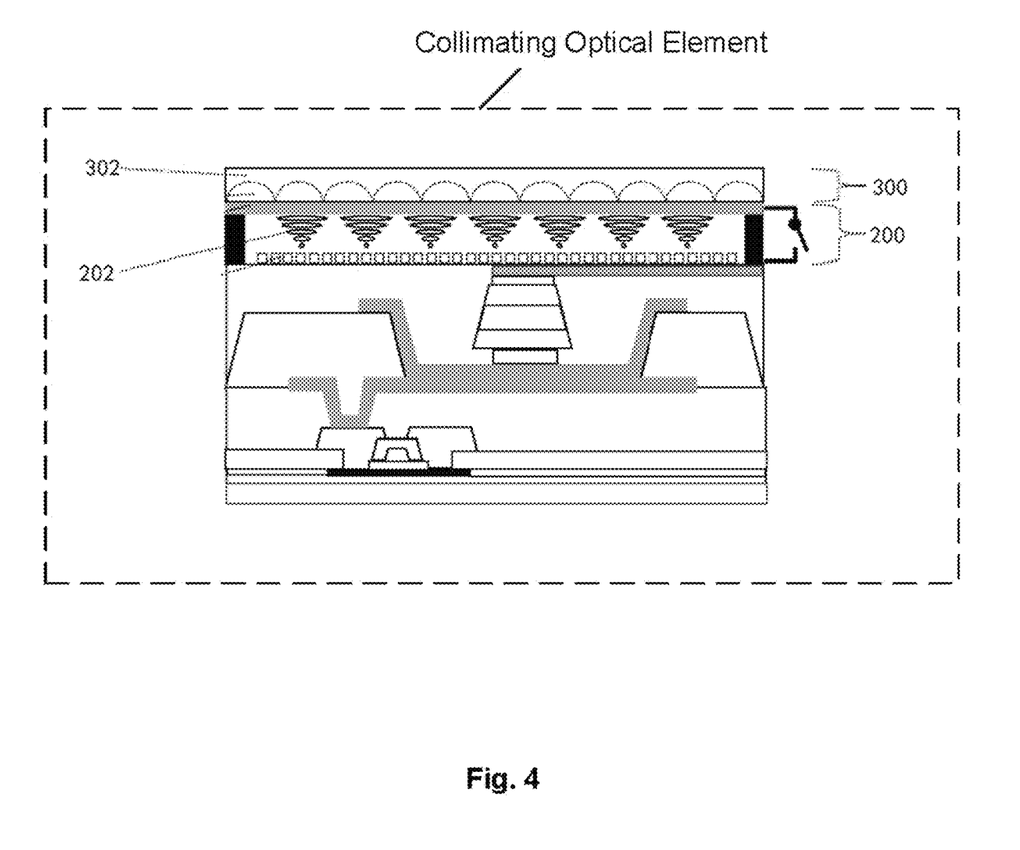
FIG. 4 is a structural schematic diagram of a collimation optical element according to an embodiment of the present disclosure.

Specifically, as shown in FIG. 4, the angle control structure includes: an optical axis control apparatus and an optical film structure successively configured along an emitting light path of the emitting main light of the LED chip.

The optical axis control apparatus includes: a metal wire gate electrode, a transparent electrode and an optical rotation material layer successively configured along the emitting light path of the LED chip, and the optical rotation material layer is used for changing polarizability of the emitting main light.

The optical film structure includes: a macromolecule liquid crystal layer used for refracting the incident emitting main light.

The optical film structure 300 includes: the macromolecule liquid crystal layer used for refracting the emitting main light and a UV resin layer 302 configured along the emitting light path of the LED chip and covering the outside of the macromolecule liquid crystal layer. The macromolecule liquid crystal layer has a first refractive index and a second refractive index for polarized light at different incident angles respectively, and an emitting direction of the polarized light refracted by the first refractive index and an emitting direction of the polarized light refracted by the second refractive index are axially orthogonal.

Figure 5:
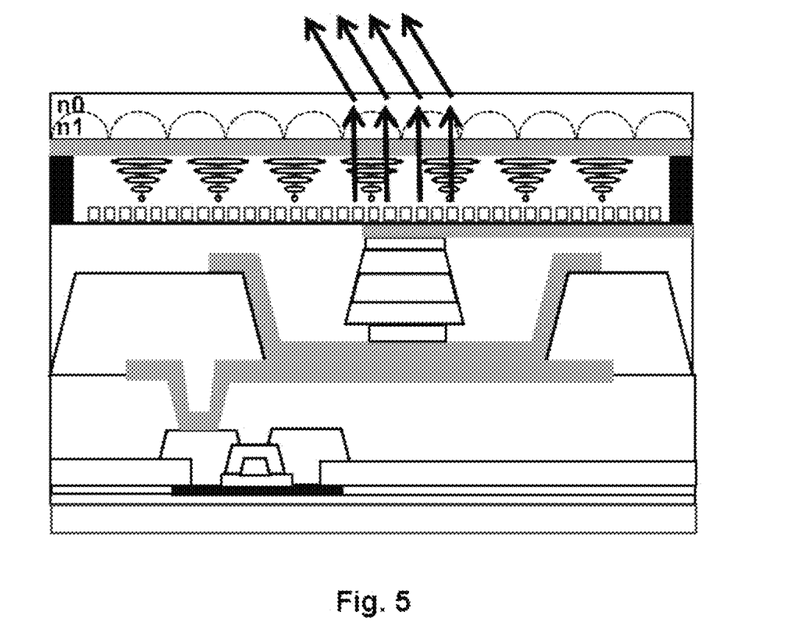
FIG. 5 is a schematic diagram of emitting light of a first display mode according to an embodiment of the present disclosure.
Figure 7:
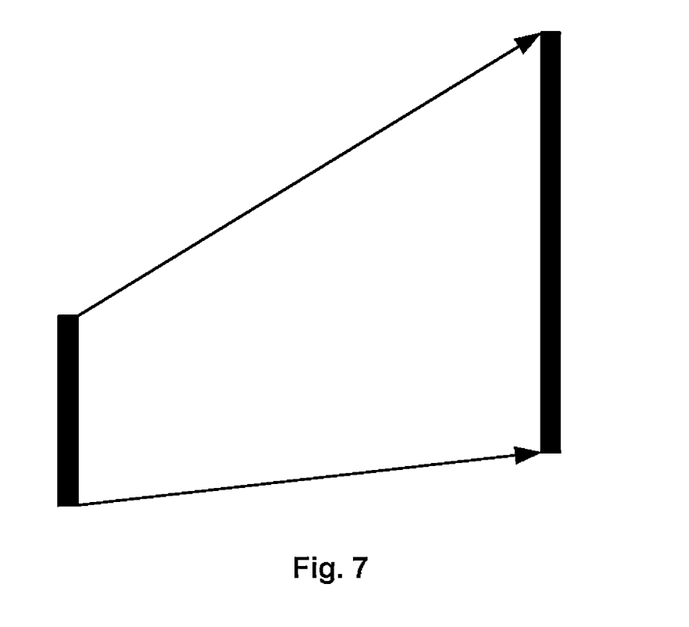
FIG. 7 is a schematic diagram of a first projection image according to an embodiment of the present disclosure.

As shown in FIG. 5, when the image source controller controls the LED display to be operated in the first display mode and the image source controller sends the first image signal to the LED display, the light emitted from the LED chip forms linear polarized light through a metal wire gate, a voltage is not applied to the optical axis control apparatus 200 at this moment, that is the optical axis control apparatus is not connected with a power supply. A light direction of the linear polarized light is rotated at a certain angle due to the action of an optical rotation material layer 202, the angle may be 90 degrees, the linear polarized light of which the direction is rotated at 90 degrees is incident on a birefraction optical film. An axial refractive index is n1, the light generates first angle refraction after passing through a material with the refractive indexes n1 and n0. The first image obtained after the first angle refraction is projected to the projection screen, and a display effect of the first image is as shown in FIG. 7.

Figure 6:
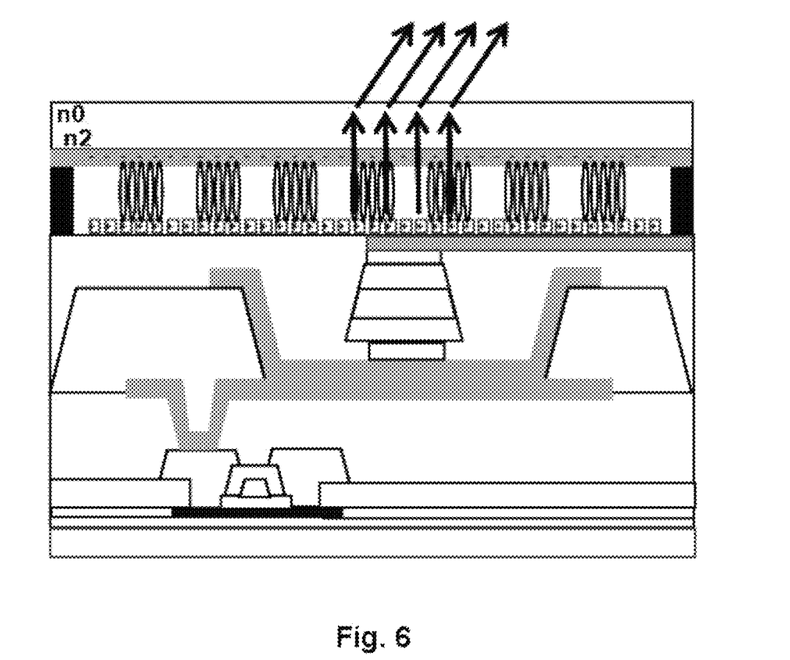
FIG. 6 is a schematic diagram of emitting light of a second display mode according to an embodiment of the present disclosure.
Figure 8:
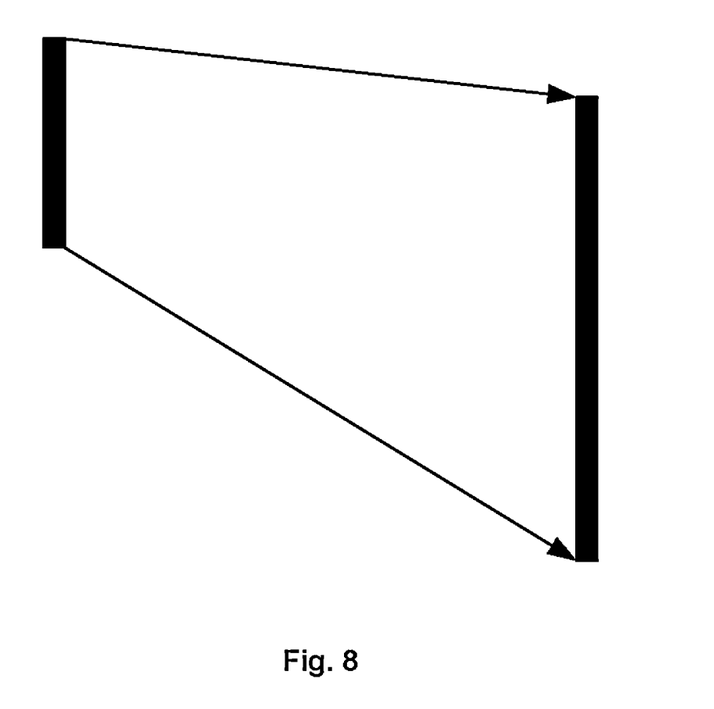
FIG. 8 is a schematic diagram of a second projection image according to an embodiment of the present disclosure.

As shown in FIG. 6, when the image source controller controls the LED display to be operated in the second display mode and the image source controller sends the second image signal to the LED display, the light emitted from the LED chip forms the linear polarized light through the metal wire gate, an alternating voltage is applied to the optical axis control apparatus, that is, the optical axis control apparatus is connected with the power supply. The linear polarized light is rotated at a certain angle due to the characteristics of an optical rotation material, the angle may be 90 degrees, the linear polarized light of which the direction is rotated at 90 degrees is incident on the birefraction optical film. The axial refractive index is n1, the light generates the first angle refraction after passing through the material with the refractive indexes n1 and n0, the second image obtained after the second angle refraction is projected to the projection screen. And a display effect of the second image is as shown in FIG. 8.

Figure 9:
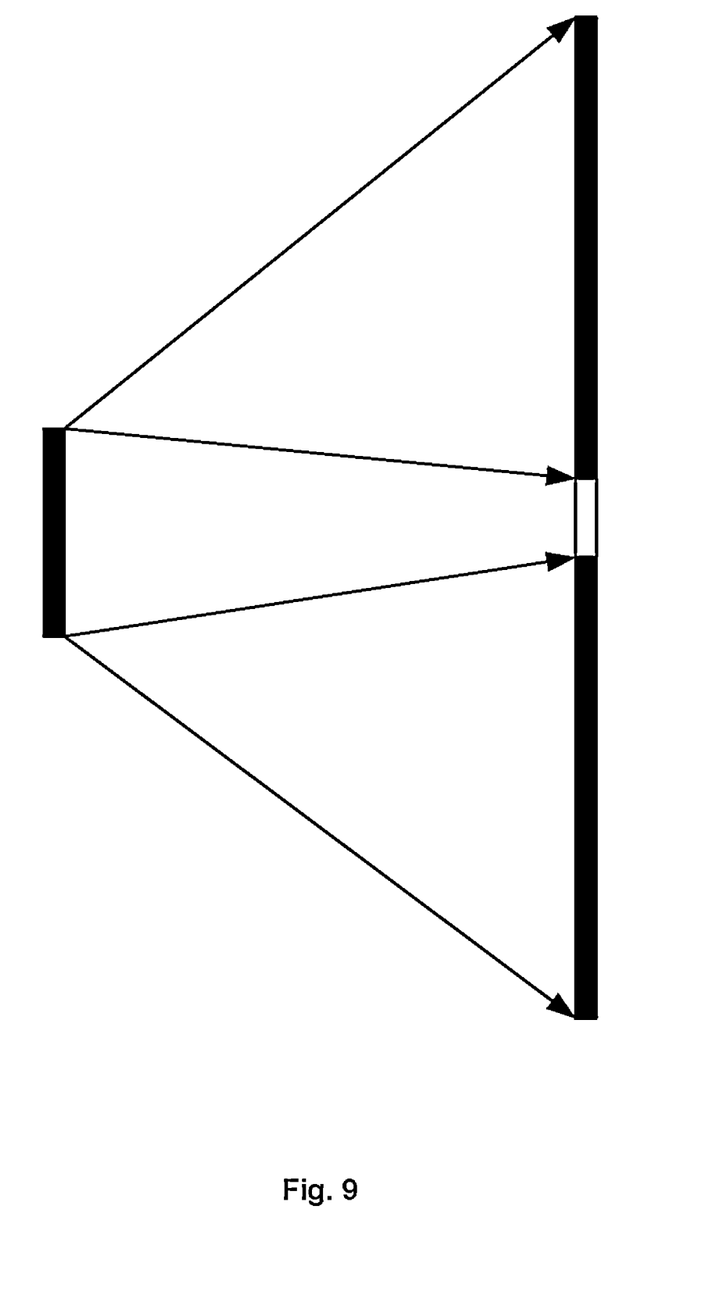
FIG. 9 is a display schematic diagram after projection images are spliced according to an embodiment of the present disclosure.

In the present embodiment, a time period in which the image source controller controls the LED display to switch between the first display mode and the second display mode is configured within a preset time period, and the preset time period is visual persistence time period in which the first image and the second image may not be distinguished by the human eyes. That is, when the persistence time period of the first image received in the projection screen is a time period 0-1/2T and the emitting angle of the light emitted by each LED chip is modulated to be a first emitting angle within the time period 0-1/2T, a projection image 1 is projected. And when the persistence time period of the second image received in the projection screen is a time period 1/2T-1T and the emitting angle of the light emitted by each LED chip is modulated to be a second emitting angle within the time period 1/2T-1T, a projection image 2 is projected. Therefore, in the preset time period T, an image seen by the human eyes is a spliced image formed by the first image and the second image. When the first image and the second image are two parts of a whole image respectively, the whole image may be spliced on the basis of the first image and the second image, as shown in FIG. 9.

In order to achieve miniaturization of the projection system, the LED chip in the LED display in the present embodiment is a Micro LED.

In a specific implementation mode of the present embodiment, a projection lens may also be configured between the LED display and the projection screen, the projection lens is used for amplifying the received image, thereby achieving an effect of further amplification of the projection image.

Figure 10:
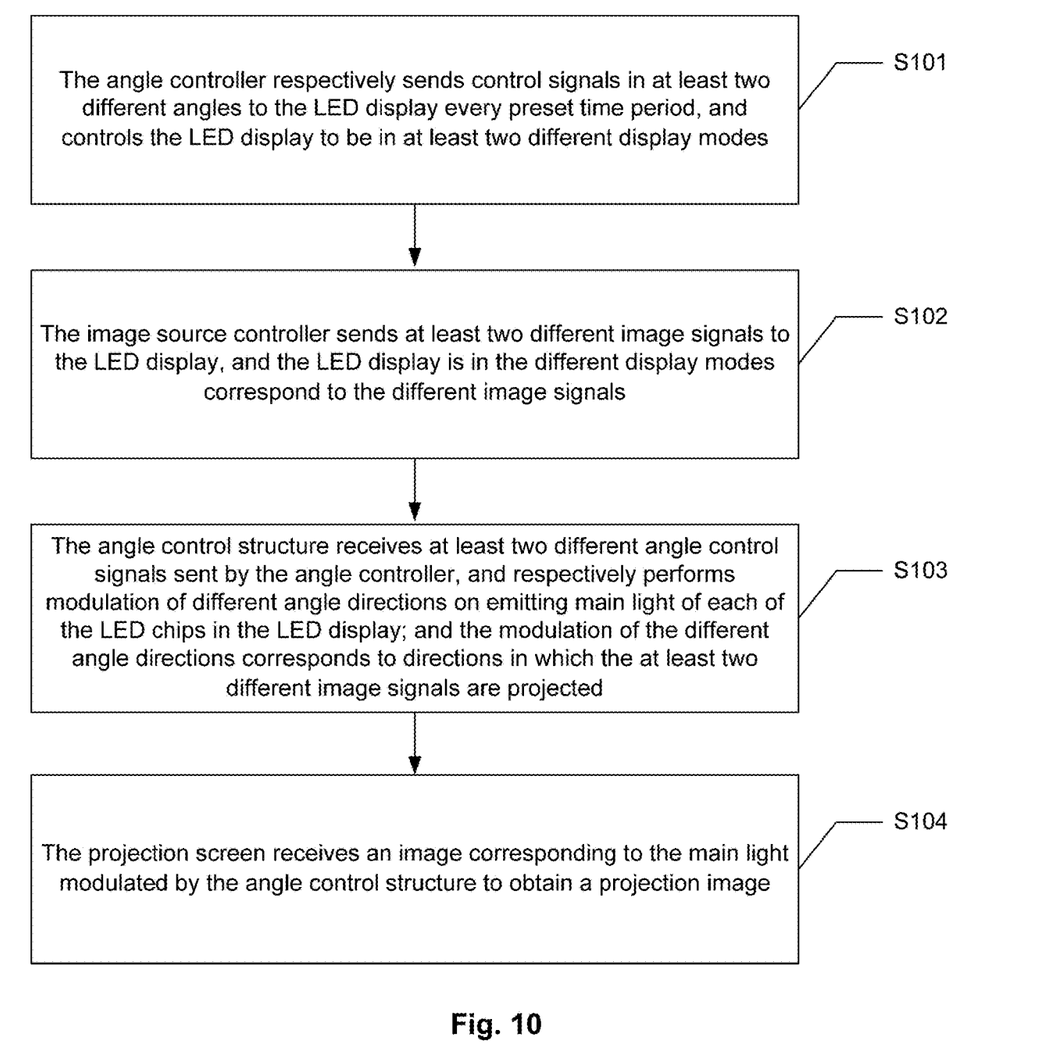
FIG. 10 is a process schematic diagram of an optical projection imaging method according to an embodiment of the present disclosure.

The present embodiment further discloses a projection imaging method, which is applied to the projection imaging system, as shown in FIG. 10, the projection imaging method includes the following steps.

In step S101, the angle controller respectively sends control signals in at least two different angles to the LED display every preset time period, and controls the LED display to be in at least two different display modes. And the preset time period is a visual persistence time period in which a first image and a second image may not be distinguished by human eyes.

In one implementation mode, the display mode includes a first display mode and a second display mode, and the at least two different image signals includes a first image signal and a second image signal; and the projection image is an image spliced by the first image and the second image projected by the LED display every the preset time period.

Specifically, the at least two different angle control signals include a first angle control signal and a second angle control signal. The first angle control signal is used for controlling the LED display to be in the first display mode, and the second angle control signal is used for controlling the LED display to be in the second display mode. And the preset time period is a human eye visual persistence time period.

In step S102, the image source controller sends at least two different image signals to the LED display, and the LED display is in the different display modes correspond to the different image signals.

The image source controller sends the different image signals to the LED display, and the different image signals are sent every the preset time period.

The operation that the image source controller sends the at least two different image signals to the LED display includes the following steps.

When the LED display is in the first display mode, the image source controller sends the first image signal to the LED display, and when the LED display is in the second display mode, the image source controller sends the second image signal to the LED display.

In step S103, the angle control structure receives at least two different angle control signals sent by the angle controller, and respectively performs modulation of different angle directions on emitting main light of each of the LED chips in the LED display; and the modulation of the different angle directions corresponds to directions in which the at least two different image signals are projected.

The angle control structure arranged above the LED chip is used for performing the modulation of the different angle directions on the direction of the main light emitted by the LED chip according to the at least two different angle control signals sent from the angle controller. The first angle control signal sent by the angle controller is used for adjusting the first angle of the main light emitted by the LED chip, and the second angle control signal sent by the angle controller is used for adjusting the second angle of the main light emitted by the LED chip.

In one implementation mode, the angle controller includes: an optical axis control apparatus and an optical film structure.

The optical axis control apparatus includes: a metal wire gate electrode, a transparent electrode and an optical rotation material layer.

The optical film structure includes: a macromolecule liquid crystal layer.

The operation that the angle controller respectively sends the first angle control signal and the second control signal to adjust and control an emitting angle of the emitting main light emitted by each of the LED chips includes the following steps.

When the first angle control signal is sent by the angle controller, the emitting main light emitted by each of the LED chips forms linear polarized light through the metal wire gate electrode; and under the action of the optical rotation material layer, the linear polarized light is enabled to be incident on the optical film structure, and emits at the first angle after being refracted by the optical film structure.

Or, when the second angle control signal is sent by the angle controller, the emitting main light emitted by the LED chip forms linear polarized light through the metal wire gate electrode; and under the adjustment of the optical axis control apparatus, the linear polarized light is enabled to be incident on the optical film structure in an original emitting angle, and emits at the second angle after being refracted by the optical film structure.

Specifically, the operation that under the adjustment of the optical axis control apparatus, the linear polarized light is enabled to be incident on the optical film structure at the original emitting angle further includes the following step.

The optical axis control apparatus is enabled to be connected with an alternating current power supply, so that an output emitting angle of the linear polarized light input to the optical axis control apparatus by the optical rotation material layer remains unchanged.

In step S104, the projection screen receives an image corresponding to the main light modulated by the angle control structure to obtain a projection image.

The projection screen configured in front of a main light beam emitted by the LED display receives the emitting main light beam modulated by the angle control structure, and projection is performed on the main light beam to obtain the projection image.

Since the projection image includes two images to be spliced respectively displayed in two display modes by the LED display, and the two images are projected to the projection screen through the different angles to splice a whole image, thereby achieving amplification of the image through a splicing mode.

After the operation that the image source controller sends the at least two different image signals to the LED display, the optical projection imaging method further includes the following steps.

Each of the LED chips in the LED display sends the corresponding emitting main light corresponding to a received image signal.

The collimation optical element performs collimation processing on the emitting main light of the LED chip.

In an optional embodiment, before the operation that the projection screen receives the image corresponding to the main light modulated by the angle control structure to obtain the projection image, further including the following step.

After the emitting main light emitted by the LED display is amplified, amplified emitting main light is projected to the projection screen.

In one implementation mode of the present embodiment, when the spliced image to be projected is a whole image, the image source controller processes the whole image to be projected to obtain a first image and a second image. The first image and the second image are two parts of the whole image respectively, it is satisfied that the image spliced by the first image and the second image is the whole image, the middle of the whole image has some overlapped images.

The image source controller respectively controls the LED projection screen to project a first part image, namely the first image, of the whole image and the LED projection screen is switched to project a second part image, namely the second image, of the whole image every the preset time period.

The angle controller is configured in a light path of the light emitted by the LED chip, and used for adjusting and controlling a propagation direction of the light emitted by the LED chip. When the light emitted by the LED chip corresponds to the first image projected, the light corresponding to the first image is controlled to be emitted after first angle refraction. And when the light emitted by the LED chip corresponds to the second image projected, the light corresponding to the second image is controlled to be emitted after second angle refraction. It is conceivable that in order to achieve complete splicing of the whole image, a position of the first image in the whole image corresponds to the first angle. When the position corresponding to the first image is a left half image of the whole image, an angle of the first image should be adjusted to be projected to a display interface on the left half of the projection screen. When the position corresponding to the second image is a right half image of the whole image, a second angle is correspondingly projected to a position on the right half of the projection screen. When the position of the first image corresponding to the whole image is an upper half or a lower half, it is similar to the above implementation mode.

In order to achieve the better emitting optical adjustment effect, in the light path of the light emitted by the LED chip, a collimation optical element is further configured, and the collimation optical element includes: a micro-lens array, a micro-ring-type structure or a photonic crystal array, the collimation optical element is used for performing collimation processing on the light emitted by the LED chip.

After considering the description and practicing the present disclosure disclosed here, those skilled in the art may easily think of other implementation schemes. The present disclosure is intended to cover any variations, usages or adaptive changes of the present disclosure, these variations, usages or adaptive changes follow general principles of the present disclosure and include common knowledge or conventional technical means in the technical field which are not disclosed by the present disclosure. The description and the embodiments are regarded as exemplary, and real scope and spirit of the present disclosure are pointed out by the following claims.

It is to be understood that the present disclosure is not limited to the precise structure described above and shown in the drawings, and various modifications and changes may be made without departing from the scope thereof. The scope of the present disclosure is limited by the appended claims.

What is claimed is:

1. An optical projection imaging system, comprising: an image source controller, a projection screen, an angle controller and a Light Emitting Diode (LED) display; the LED display comprising: a plurality of LED display components, each of the LED display components comprising: an LED chip and an angle control structure arranged above the LED chip;

the angle controller, configured to send at least two different angle control signals to the LED display every preset time period to control the LED display to be in at least two different display modes;

the image source controller, configured to send at least two different image signals to the LED display, wherein the LED display in the different display modes corresponds to different image signals;

the angle control structure, configured to receive at least two different angle control signals sent by the angle controller, and to respectively perform modulation of different angle directions on an emitting main light direction of each of the LED chips in the LED display, the modulation of the different angle directions corresponding to directions in which the at least two different image signals are projected; and the projection screen, configured to receive an image corresponding to the emitting main light modulated by the angle control structure to obtain a projection image.

2. The optical projection imaging system as claimed in claim 1, wherein the at least two different display modes comprises a first display mode and a second display mode, the at least two different image signal comprises a first image signal and a second image signal, and the projection image is an image spliced by a first image corresponding to the first image signal and a second image corresponding to the second image signal.

3. The optical projection imaging system as claimed in claim 2, wherein the angle control structure comprises: an optical axis control apparatus and an optical film structure successively configured along an emitting light path of the emitting main light of the LED chip;

the optical axis control apparatus comprises: a metal wire gate electrode, a transparent electrode and an optical rotation material layer successively configured along the emitting light path of the LED chip, the optical rotation material layer being used for changing polarizability of the emitting main light; and the optical film structure comprises: a macromolecule liquid crystal layer used for refracting the emitting main light.

4. The optical projection imaging system as claimed in claim 3, wherein the macromolecule liquid crystal layer respectively has a first refractive index and a second refractive index for polarized light at different incident angles, and an emitting direction of the polarized light refracted by the first refractive index and an emitting direction of the polarized light refracted by the second refractive index are axially orthogonal.

5. The optical projection imaging system as claimed in claim 3, wherein the optical film structure further comprises: a UV resin layer configured after the macromolecule liquid crystal layer along the emitting light path of the LED chip.

6. The optical projection imaging system as claimed in claim 1, wherein the LED display further comprises: a collimation optical element configured to collimate the emitting main light of the LED chip, the collimation optical element comprising: a micro-lens array, a micro-ring-type structure or a photonic crystal array.

7. The optical projection imaging system as claimed in claim 1, further comprising a projection lens configured between the LED display and the projection screen;

the projection lens, configured to receive and amplify the emitting main light emitted by the LED display.

8. The optical projection imaging system as claimed in claim 1, wherein the LED chip is a Micro-LED.

9. An optical projection imaging method, applied to the projection imaging system as claimed in claim 1, wherein the projection imaging method comprises:

respectively sending, by the angle controller, control signals in at least two different angles to the LED display every preset time period, and controlling, by the angle controller, the LED display to be in at least two different display modes;

sending, by the image source controller, at least two different image signals to the LED display, wherein the LED display is in the different display modes correspond to the different image signals;

receiving, by the angle control structure, at least two different angle control signals sent by the angle controller, and respectively performing, by the angle control structure, modulation of different angle directions on emitting main light of each of the LED chips in the LED display, wherein the modulation of the different angle directions corresponds to directions in which the at least two different image signals are projected; and receiving, by the projection screen, an image corresponding to the emitting main light modulated by the angle control structure to obtain a projection image.

10. The optical projection imaging method as claimed in claim 9, wherein the at least two different display mode comprises a first display mode and a second display mode, and the at least two different image signals comprises a first image signal and a second image signal; and the projection image is an image spliced by a first image and a second image projected by the LED display every preset time period.

11. The optical projection imaging method as claimed in claim 10, sending, by the image source controller, the at least two different image signals to the LED display comprises:

when the LED display is in the first display mode, sending, by the image source controller, the first image signal to the LED display; and when the LED display is in the second display mode, sending, by the image source controller, the second image signal to the LED display.

12. The optical projection imaging method as claimed in claim 9, wherein after sending, by the image source controller, the at least two different image signals to the LED display, further comprising:

sending, by each of the LED chips in the LED display, the emitting main light corresponding to a received image signal; and performing, by a collimation optical element, collimation processing on the emitting main light of the LED chip.

13. The optical projection imaging method as claimed in claim 9, wherein the at least two different angle control signals comprise a first angle control signal and a second angle control signal; the first angle control signal is used for controlling the LED display to be in the first display mode, and the second angle control signal is used for controlling the LED display to be in the second display mode.

14. The optical projection imaging method as claimed in claim 9, wherein the angle controller comprises: an optical axis control apparatus and an optical film structure;

the optical axis control apparatus comprises: a metal wire gate electrode, a transparent electrode and an optical rotation material layer;

the optical film structure comprises: a macromolecule liquid crystal layer.

15. The optical projection imaging method as claimed in claim 14, respectively sending, by the angle controller, the first angle control signal and the second control signal to adjust and control an emitting angle of the emitting main light emitted by each of the LED chips comprises:

when the first angle control signal is sent by the angle controller, forming linear polarized light by the emitting main light emitted by each of the LED chips through the metal wire gate electrode; and under the action of the optical rotation material layer, enabling the linear polarized light to be incident on the optical film structure, and to be emitted by the first angle after being refracted by the optical film structure.

16. The optical projection imaging method as claimed in claim 14, respectively sending, by the angle controller, the first angle control signal and the second control signal to adjust and control an emitting angle of the emitting main light emitted by each of the LED chips comprises:

when the second angle control signal is sent by the angle controller, forming linear polarized light by the emitting main light emitted by the LED chip through the metal wire gate electrode; and under the adjustment of the optical axis control apparatus, enabling the linear polarized light to be incident on the optical film structure in an original emitting angle, and to be emitted by the second angle after being refracted by the optical film structure.

17. The optical projection imaging method as claimed in claim 16, wherein under the adjustment of the optical axis control apparatus, enabling the linear polarized light to be incident on the optical film structure in the original emitting angle further comprises:

enabling the optical axis control apparatus to be connected with an alternating current power supply, so that an output emitting angle of the linear polarized light input to the optical axis control apparatus by the optical rotation material layer remains unchanged.

18. The optical projection imaging method as claimed in claim 9, before receiving, by the projection screen, the image corresponding to the main light modulated by the angle control structure to obtain the projection image, further comprising:

after performing amplification processing on the emitting main light emitted by the LED display, projecting amplified emitting main light to the projection screen.

19. The optical projection imaging method as claimed in claim 9, the preset time period is a human eye visual persistence time period.

20. The optical projection imaging method as claimed in claim 1, the preset time period is a human eye visual persistence time period.

* * * * *